United States Patent
Foiret et al.

(10) Patent No.: US 9,582,636 B2
(45) Date of Patent: Feb. 28, 2017

(54) METHOD OF CONSTRUCTING A BEHAVIOR MODEL OF AN AIRPLANE ENGINE

(71) Applicant: SNECMA, Paris (FR)

(72) Inventors: Guilhem Foiret, Paris (FR); Fabien Segon, Montrouge (FR)

(73) Assignee: SNECMA, Paris (FR)

( * ) Notice: Subject to any disclaimer, the term of this patent is extended or adjusted under 35 U.S.C. 154(b) by 650 days.

(21) Appl. No.: 14/068,520

(22) Filed: Oct. 31, 2013

(65) Prior Publication Data
US 2014/0129193 A1    May 8, 2014

(30) Foreign Application Priority Data
Nov. 5, 2012 (FR) ..................................... 12 60492

(51) Int. Cl.
*G05B 19/4065* (2006.01)
*G06F 17/50* (2006.01)
*G05B 17/02* (2006.01)

(52) U.S. Cl.
CPC ......... *G06F 17/5095* (2013.01); *G05B 17/02* (2013.01); *G05B 19/4065* (2013.01); *G05B 2219/36419* (2013.01)

(58) Field of Classification Search
None
See application file for complete search history.

(56) References Cited

U.S. PATENT DOCUMENTS

| | | | | |
|---|---|---|---|---|
| 5,070,458 A * | 12/1991 | Gilmore | ............... | G05D 1/0005 244/180 |
| 5,908,176 A * | 6/1999 | Gilyard | ................... | B64C 13/18 244/130 |
| 7,970,583 B2 * | 6/2011 | Novis | ................. | F15B 15/2815 702/183 |
| 8,600,917 B1 * | 12/2013 | Schimert | .................. | G06N 5/00 706/14 |
| 8,935,137 B1 * | 1/2015 | Han | ........................ | G06G 7/48 703/6 |

(Continued)

FOREIGN PATENT DOCUMENTS

EP           1926001 A2 *   5/2008   ............. F01D 21/00

OTHER PUBLICATIONS

French Preliminary Search Report issued Jun. 24, 2013, in French Application No. 12 60492 filed Nov. 5, 2012 (with Written Opinion and English Translation of Categories of Cited Documents).

*Primary Examiner* — Kibrom K Gebresilassie
(74) *Attorney, Agent, or Firm* — Oblon, McClelland, Maier & Neustadt, L.L.P.

(57) ABSTRACT

A method of constructing a behavior model (32) of an airplane engine, in particular in order to track the operation of the engine, the method comprising a training step (12) of training at least one statistical regression function on the basis of a generic database (14) containing data from a plurality of airplane engines in order to establish a generic behavior model (10) of the airplane engines, and an additional step of resetting the generic behavior model from data in a database (24) specific to the above-mentioned airplane engine, in order to establish a behavior model (32) that takes account of features specific to that engine.

7 Claims, 3 Drawing Sheets

(56) References Cited

U.S. PATENT DOCUMENTS

| | | | |
|---|---|---|---|
| 8,996,342 B1* | 3/2015 | Brennan | G06F 17/5095 703/13 |
| 9,328,687 B2* | 5/2016 | Jankovic | F02D 41/30 |
| 2002/0082723 A1 | 6/2002 | Flendrig et al. | |
| 2003/0036891 A1 | 2/2003 | Aragones et al. | |
| 2004/0135534 A1 | 7/2004 | Cullen | |
| 2005/0159934 A1 | 7/2005 | Gopal et al. | |
| 2005/0261888 A1 | 11/2005 | Chen et al. | |
| 2005/0276690 A1* | 12/2005 | Amiot | F01D 11/24 415/178 |
| 2006/0184255 A1* | 8/2006 | Dixon | G05B 13/048 700/44 |
| 2007/0078531 A1* | 4/2007 | Adra | G06Q 10/00 700/31 |
| 2009/0021205 A1 | 1/2009 | Cullen | |
| 2009/0048730 A1* | 2/2009 | Akkaram | G07C 5/006 701/31.4 |
| 2010/0036510 A1 | 2/2010 | Cullen | |
| 2010/0082267 A1* | 4/2010 | Schimert | G05B 19/4065 702/34 |
| 2010/0153330 A1* | 6/2010 | Desikachari | G06F 11/3433 706/59 |
| 2010/0280935 A1* | 11/2010 | Fellowes | G06Q 40/00 705/35 |
| 2011/0054875 A1* | 3/2011 | Chang | G06F 17/5036 703/14 |
| 2011/0173496 A1* | 7/2011 | Hosek | G05B 23/0235 714/26 |
| 2011/0288836 A1* | 11/2011 | Lacaille | G05B 23/0254 703/2 |
| 2013/0158991 A1* | 6/2013 | Dong | G08G 5/0013 704/235 |
| 2016/0292307 A1* | 10/2016 | Fainekos | G06F 17/50 |

* cited by examiner

METHOD OF CONSTRUCTING A BEHAVIOR MODEL OF AN AIRPLANE ENGINE

BACKGROUND OF THE INVENTION

The present invention relates to a method of constructing a behavior model of an airplane engine, in particular in order to track the operation of the engine.

For example in the context of tracking the starting sequences of an airplane engine, it is necessary to eliminate the influence context (such as temperature, pressure, speed, etc.) from the indicators of degradation (e.g. such as the duration of starting). In order to do this, an estimate is constructed of the value of the indicator in the non-degraded state, as a function of the context. This estimate is then subtracted from the measured value of the indicator. The result that is obtained is representative of the state of degradation of the system under study.

With a sound engine, the estimate of the indicator is constructed by means of a behavior model. This model is itself obtained by statistical regression of a reference database representative of the sound state of the engine. The size of this database has a strong influence on the quality of the training of the regression function. The larger the database and the greater the number of different contexts that it contains, the wider the range over which the trained function is valid.

In the prior art, the regression function is trained either from a generic database containing data about a fleet comprising a plurality of engines, or else from a specific database containing only data that is specific to the engine under study.

Nevertheless, both of those methods present drawbacks.

When a generic behavior model is constructed from a database concerning a plurality of engines, the model does not take account of differences between engines, such as manufacturing disparities. The model is therefore relatively inaccurate, giving rise to regression of poor performance. Nevertheless, the advantage of that model is that its large training database makes it robust when faced with contexts that are rare, and it therefore provides a range of validity that is broad.

When a specific behavior model is constructed from a database specific to one engine, the model does not benefit from data about other engines, and it is therefore constructed on a database that is not so rich and that covers fewer possible situations. It is therefore not very robust when faced with contexts that are rare, which leads to a narrower range of validity. Furthermore, the database specific to each engine is limited by the duration over which the engine has been tracked.

BRIEF SUMMARY OF THE INVENTION

A particular object of the invention is to remedy the above-mentioned drawbacks in a manner that is simple, effective, and inexpensive.

To this end, the invention provides a method of constructing a behavior model of an airplane engine, in particular in order to track the operation of the engine, the method comprising a training step of training at least one statistical regression function on the basis of a generic database containing data from a plurality of airplane engines in order to establish a generic behavior model of the airplane engines, the method being characterized in that it comprises an additional step of resetting the generic behavior model from data in a database specific to the above-mentioned airplane engine, in order to establish a behavior model that takes account of features specific to that engine.

The invention thus makes it possible to use data coming from different engines in order to improve the quality of the training and in order to construct a regression model that is specific to an engine by taking account of its specific features.

Making use of data from a plurality of engines serves to show up physical phenomena that have taken place, while ignoring the specific features of the various engines. The resetting of the model on the engine under study can be performed by optimization that involves only a limited number of parameters and that therefore requires only a small amount of training data.

The invention combines the advantages of both prior art methods since, it makes it possible to obtain a regression that is more robust than the specific regression (and thus valid over a wider range of contexts) and that is more accurate than the generic regression. The invention requires a smaller amount of training data (70% less than the specific regression in one particular implementation of the invention) because of the small number of parameters that are to be found.

The databases may comprise degradation indicators (t) and context variables ($v_i$).

The training step may comprise the sub-steps of:

a/ for at least one degradation indicator (t) of the generic database, determining a regression function ($f_i$) for each context variable ($v_i$) having an influence on this indicator; and b/ modeling the or each indicator by optimizing regression functions determined in the preceding sub-step.

The optimization is preferably performed by the least-squares method. Nevertheless, other optimization methods could be used.

By way of example, the regression functions may be polynomial functions.

The resetting step may include a sub-step of optimizing the or each indicator by a new statistical regression from the database specific to the engine. The optimization is preferably performed by the least-squares method. Nevertheless, other optimization methods could be used.

The method may comprise the additional steps consisting in:

x/ measuring a real value of an indicator of the airplane engine in flight, and also the associated context variables;

y/ using the behavior model of the airplane engine to estimate the value expected for the indicator as a function of the measured context variables; and z/ calculating the difference between the value expected for the indicator and the real value of the indicator.

The steps x/, y/, and z/ may be repeated for each flight of the airplane, and the calculated differences are stored in a database and compared with one another in order to detect any degradation having an impact on the value of the indicator.

BRIEF DESCRIPTION OF THE SEVERAL VIEWS OF THE DRAWINGS

The invention can be better understood and other details, characteristics, and advantages of the invention appear on reading the following description made by way of non-limiting example with reference to the accompanying drawings, in which.

DETAILED DESCRIPTION OF THE INVENTION

Figure 1:
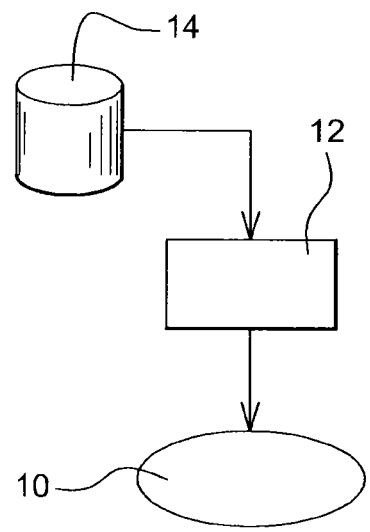
FIG. 1 is a block diagram showing a prior art method of constructing a generic behavior model.
Figure 2:
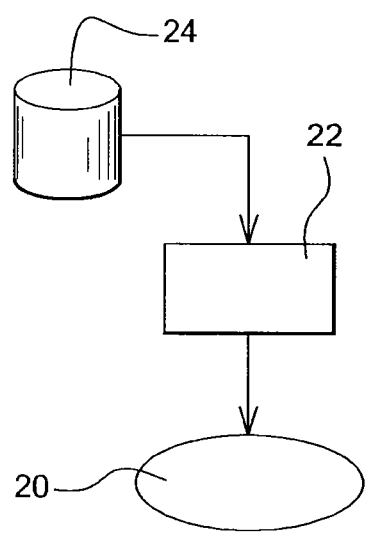
FIG. 2 is a block diagram showing a prior art method of constructing a specific behavior model.

FIGS. 1 and 2 show prior art methods of constructing behavior models of airplane engines, these airplane engines being turbine engines such as turboprops or turbojets, for example.

In FIG. 1, a generic behavior model 10 is constructed by training 12 at least one statistical regression function from a generic database 14 containing data coming from a plurality of engines in a fleet.

In FIG. 2, a specific behavior model 20 is constructed by training 22 from at least one statistical regression function on the basis of a database 24 specific to the engine under study.

Nevertheless, those methods suffer from the drawbacks described above.

Figure 3:
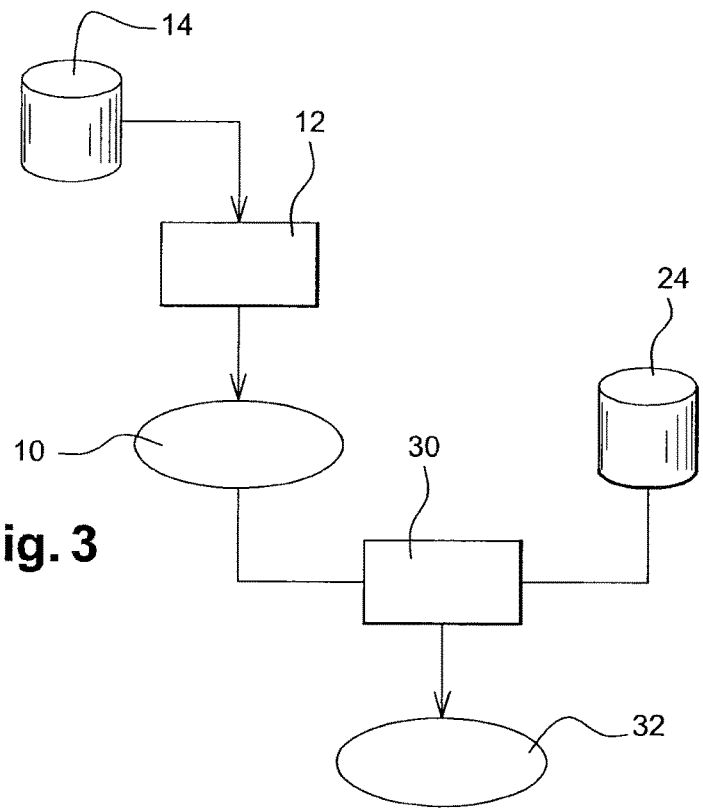
FIG. 3 is a block diagram showing the method of the invention for constructing a generic behavior model that is reset for an engine under consideration.

The method of the invention, as shown diagrammatically in FIG. 3 is based firstly on obtaining a generic behavior model 10 of the above-specified type, but it differs from the method of FIG. 1 in that it also includes a resetting step 30 of resetting this generic model on the basis of data from the database 24 that is specific to the engine under study, in order to establish a re-set behavior model 32 that takes account of specific features of this engine.

The idea is to make use of all of the data from the various engines in a fleet by training a generic regression function. This reveals the physical phenomenon that is taking place, but ignores features specific to the various engines. Thereafter, this generic function is reset specifically on the engine under study, e.g. with the help of new optimization involving only a limited number of parameters and therefore requiring only a small amount of training data. The purpose is to obtain a regression that is more accurate than the generic regression, while being more robust in the face of rare contexts than is the specific regression.

There follows a description of a particular implementation of the method of the invention.

A first step of the method of the invention consists in training the generic regression function.

Initially and for reasons of simplification, it is desired to model a single indicator that is referred to as t, and making use of m context variables written $v_1$.

For each context variable, with a polynomial regression of order n, a search is made for the regression function having the form:

$$f_i(v_i) = \alpha_i^0 + \alpha_i^1 v_i + \alpha_i^2 v_i^2 + \alpha_i^3 v_i^3 + \alpha_i^4 v_i^4 + \ldots + \alpha_i^n v_i^n$$

Given that there are m context variables for modeling t, there are thus m regression functions $f_i$.

A conventional ordinary least squares optimization (other methods are also applicable) makes it possible to obtain the coefficients of the regression, which are none other than the coefficients $\alpha_i^j$ with i=[1:m] and j=[0:n]. The regression is thus characterized by i*j coefficients.

By way of example, if it is desired to model an indicator by four context variables using a polynomial regression of order 5, a coefficient matrix of size 4*6 is obtained (i.e. having 24 degrees of freedom for the optimization).

It is then possible to estimate the value of the indicator t, as a function of the context variables $v_i$, as follows:

$$\hat{t}_{generic} = \sum_{i=1}^{m} f_i(v_i)$$

For this first regression, the training makes use of the generic database containing the data from the different engines (a large database is thus preferred for reasons of robustness). A generic regression function is thus obtained on this database.

Another step of a method of the invention consists in resetting the generic function on the database specific to the engine.

It is now sought to take account of features specific to a particular engine. To do this, a second optimization is performed (e.g. still using ordinary least squares), while leaving only an affine resetting function as degrees of freedom, i.e. for the given indicator t, a function is sought having the form:

$$\hat{t}_{re-set} = \beta_0 + \sum_{i=1}^{m} \beta_i f_i(v_i)$$

where beta 0 and beta i are constants.

The new regression may be referred to as a "re-set" regression.

In the particular example given above, where m=4 and n=5, the resetting is characterized by only five coefficients (one for the additive bias, and four multiplicative coefficients, one per context variable).

A second optimization has thus been performed on the basis of data that is specific to the engine under study, but with many fewer degrees of freedom than were used in the first optimization (about five times fewer in this example).

This makes it possible to retain the general appearance of the generic function (which is very robust), while taking account of the specific features of the engine being modeled.

The person skilled in the art specialized in the technical field in question has sufficient general knowledge to be able to optimize the regression model from a database, as a function of predetermined degrees of freedom.

Once the re-set regression model has been trained, it can be used to eliminate the influence of the context on the indicator and to retain only the impact of the degradation being monitored.

Figure 7:
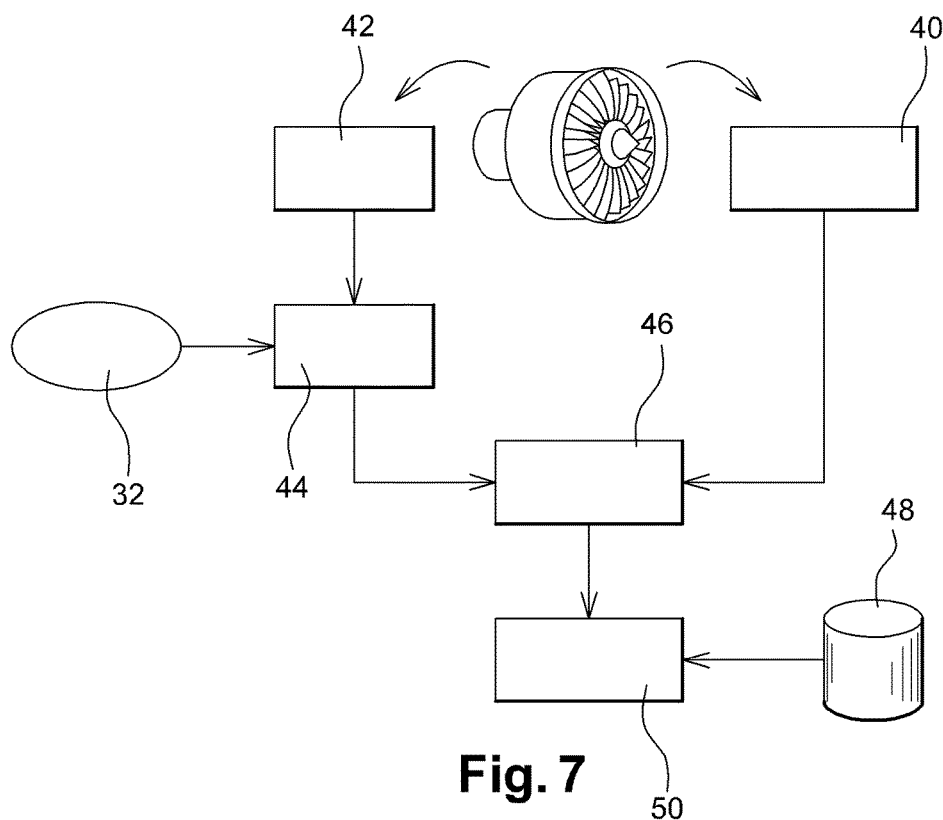
FIG. 7 is a block diagram showing other steps of the method of the invention for tracking the operation of an airplane engine.

FIG. 7 shows additional steps of the method of the invention for tracking the operation of an engine. The method comprises the additional steps consisting in:

measuring the real value of the indicator 40 while the airplane is in flight, together with context variables 42 associated with this indicator;

using the re-set regression function 32 for estimating the value expected for the indicator 44 as a function of the measured context variables 42; and calculating the difference 46 between the value expected for the indicator and its measured real value.

The steps can be repeated for each flight, and the calculated differences 46 can be recorded in a database 48 and compared with one another in order to detect any degradation having an effect on the value of the indicator, thereby tracking 50 the operation of the engine.

Figure 4:
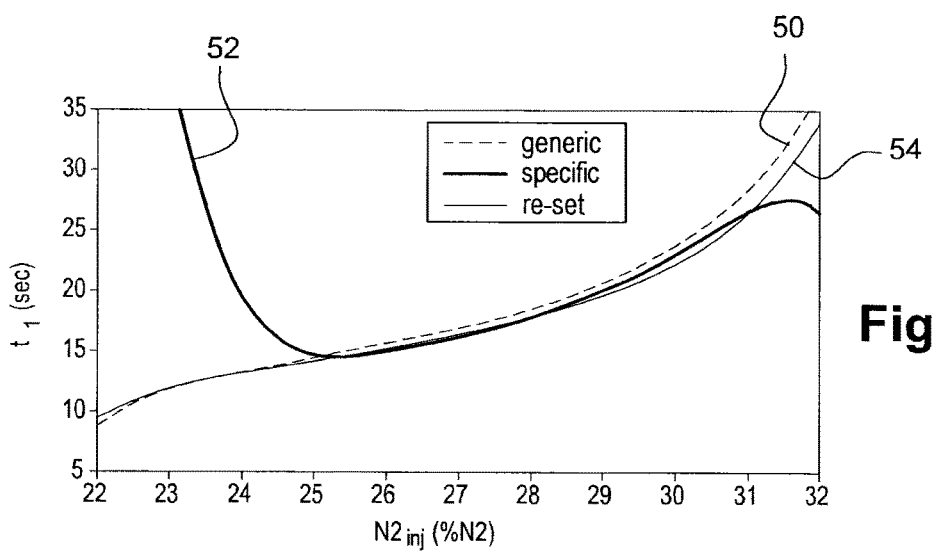
FIG. 4 is a graph showing how a degradation indicator $t_1$ varies as a function of a context variable $N2_{inj}$, and it comprises three curves respectively showing the regression functions obtained by the generic, specific, and re-set genetic behavior models.
Figure 5:
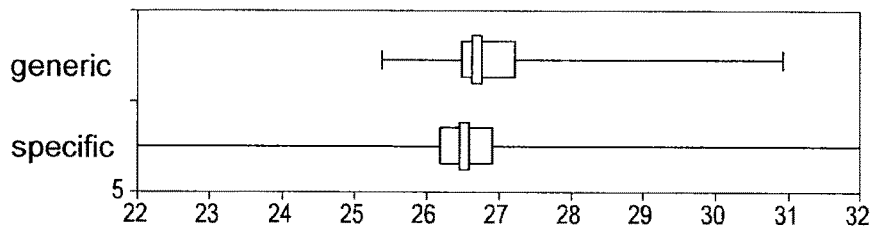
FIG. 5 comprises Tukey box-and-whisker plots showing the distribution of the generic and specific populations, depending on the context variable $N2_{inj}$.
Figure 6:
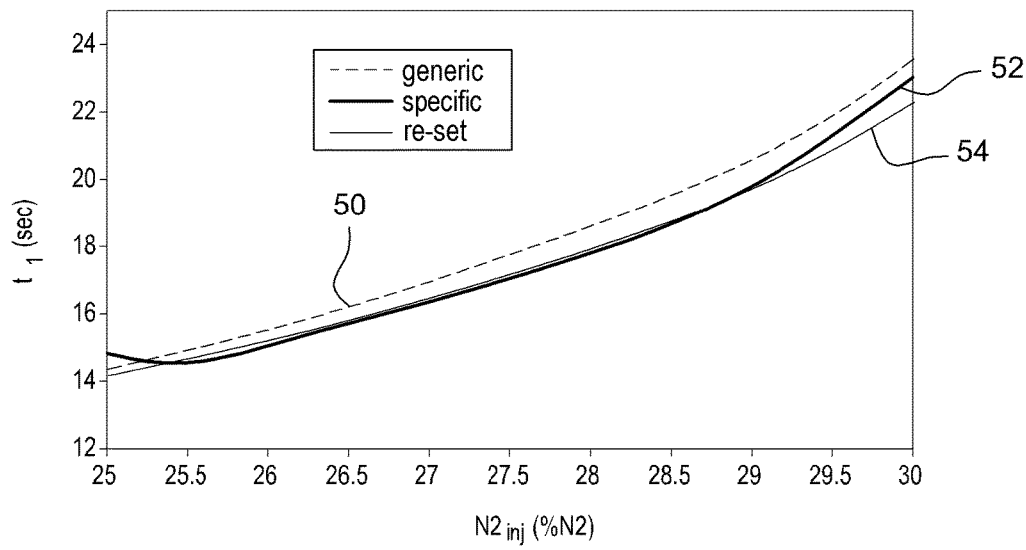
FIG. 6 is a graph showing a portion of the curves in the graph of FIG. 4, on a larger scale.

Reference is made below to FIGS. 4 to 6, which show the advantages of the method of the invention compared with methods of the prior art.

In the example shown, it is desired to model the indicator "t1" via the context of variable "$N2_{inj}$". t1 is the duration of the first stage of starting the engine. This stage begins when the high-pressure spool of the engine begins to rotate, and it terminates when the crew cause fuel to be injected. This instance of injection is identified by the variable $N2_{inj}$, which is the speed of rotation of the high-pressure spool during injection. Clearly the later the time when fuel is injected, the longer the duration of the first stage. In other words, the regression function giving t1 as a function of $N2_{inj}$ is expected to be an increasing function.

FIG. 4 is a graph in which the curves 50, 52, and 54 represent regression functions of the indicator t1 as a function of the variable $N2_{inj}$, as established respectively by generic regression (method of FIG. 1), by specific regression (method of FIG. 2), and by reset generic regression (method of the invention as shown in FIG. 3). The graph of FIG. 6 shows a portion of the curves of FIG. 4 on a larger scale over the range 25% to 30% of N2 for $N2_{inj}$.

FIG. 5 comprises Tukey box-and-whisker plots showing the distributions of the generic and specific populations (top and bottom plots) as a function of the variable $N2_{inj}$.

It can be seen that the re-set regression 54 conserves the general shape of the generic regression 50. It therefore benefits from the robustness properties of the generic regression over contexts that are rare ($N2_{inj}<25\%$ and $N2_{inj}22$ 31%). Its range of validity is therefore extended compared with the specific regression 52.

Furthermore, the re-set regression 54 comes close to the specific regression 52 over the portion that is populated by the specific database ($25\% < N2_{inj} < 30\%$—cf. FIG. 6). Some of the specific features of the engine under study are thus taken into account.

The invention claimed is:

1. A method for tracking an operation of an identified airplane engine, the method comprising:
    acquiring first data from a plurality of airplane engines;
    storing the first data in a generic database;
    training at least one statistical regression function in connection with the generic database for establishing a generic behavior model of the plurality of airplane engines;
    acquiring second data from the identified airplane engine;
    storing the second data in a specific database specific to the identified airplane engine;
    resetting the generic behavior model in connection with the second data stored in the specific database for establishing a specific behavior model that takes into account features specific to the identified airplane engine; and
    tracking the operation of the identified airplane engine based on the specific behavior model,
    wherein the generic and specific databases include degradation indicators (t) and context variables ($v_i$),
    wherein training the at least one statistical regression function further comprises:
        determining a regression function ($f_i$) for each context variable ($v_i$) having an influence on at least one degradation indicator (t) obtained from the generic database, and
        modeling each degradation indicator (t) by optimizing the regression functions ($f_i$),
    wherein resetting the generic behavior model further comprises optimizing each degradation indicator (t) by an additional statistical regression in connection with the specific database for leaving only an affine resetting function as degrees of freedom, and
    wherein tracking the operation of the identified airplane engine further comprises
        measuring a value of the degradation indicator (t) and corresponding context variables ($v_i$) while the identified airplane is in flight,
        using the additional statistical regression for estimating a value expected for the degradation indicator (t) as a function of the measured corresponding context variables ($v_i$), and
        calculating a difference between the expected value for the degradation indicator (t) and the measured value of the degradation indicator (t).

2. The method for tracking according to claim 1, wherein the optimizing is performed by a least squares method.

3. The method for tracking according to claim 1, wherein each regression function ($f_i$) is a polynomial function.

4. The method for tracking according to claim 1, wherein the measuring, using, and calculating steps are repeated for each flight of the airplane, and
    wherein the calculated differences are stored in a database and compared with one another for detecting a degradation having an impact on the value expected for the degradation indicator.

5. The method for tracking according to claim 1, wherein the additional statistical regression is a function represented as follows:

$$\hat{t}_{re-set} = \beta_0 + \sum_{i=1}^{m} \beta_i f_i(v_i)$$

where $\beta_0$ and $\beta_i$ are constants.

6. The method for tracking according to claim 1, wherein the step of tracking the operation of the identified airplane engine comprises applying said specific behavior model to the identified airplane engine during tracking of starting sequences of the identified airplane engine.

7. A method for tracking an operation of an identified airplane engine, the method comprising:
    acquiring first data from a plurality of airplane engines;
    storing the first data in a generic database;
    training at least one statistical regression function in connection with the generic database for establishing a generic behavior model of the plurality of airplane engines;
    acquiring second data from the identified airplane engine;
    storing the second data in a specific database specific to the identified airplane engine;
    resetting the generic behavior model in connection with the second data stored in the specific database for establishing a specific behavior model that takes into account features specific to the identified airplane engine; and tracking the operation of the identified airplane engine based on the specific behavior model,
wherein the generic and specific databases include degradation indicators (t) and context variables ($v_i$),
wherein training the at least one statistical regression function further comprises:
  determining a regression function ($f_i$) for each context variable ($v_i$) having an influence on at least one degradation indicator (t) obtained from the generic database, and
  modeling each degradation indicator (t) by optimizing the regression functions ($f_i$), and
wherein resetting the generic behavior model further comprises optimizing each degradation indicator (t) by an additional statistical regression in connection with the specific database for leaving only an affine resetting function as degrees of freedom.

* * * * *